United States Patent
Yang

(10) Patent No.: US 10,446,252 B2
(45) Date of Patent: Oct. 15, 2019

(54) DATA STORAGE DEVICE AND METHOD FOR DATA ERROR MANAGEMENT

(71) Applicant: Shannon Systems Ltd., Shanghai (CN)

(72) Inventor: Xueshi Yang, Cupertino, CA (US)

(73) Assignee: SHANNON SYSTEMS LTD., Shanghai (CN)

(*) Notice: Subject to any disclaimer, the term of this patent is extended or adjusted under 35 U.S.C. 154(b) by 171 days.

(21) Appl. No.: 15/864,219

(22) Filed: Jan. 8, 2018

(65) Prior Publication Data

US 2018/0336961 A1    Nov. 22, 2018

(30) Foreign Application Priority Data

May 22, 2017    (CN) .......................... 2017 1 0362875

(51) Int. Cl.
| | |
|---|---|
| *G11C 29/44* | (2006.01) |
| *G06F 12/02* | (2006.01) |
| *G11C 29/42* | (2006.01) |
| *G11C 29/52* | (2006.01) |

(52) U.S. Cl.
CPC .......... *G11C 29/44* (2013.01); *G06F 12/0246* (2013.01); *G06F 12/0253* (2013.01); *G11C 29/42* (2013.01); *G11C 29/4401* (2013.01); *G11C 29/52* (2013.01); *G06F 2212/1032* (2013.01); *G06F 2212/2022* (2013.01); *G06F 2212/7204* (2013.01); *G06F 2212/7205* (2013.01); *G06F 2212/7207* (2013.01)

(58) Field of Classification Search
CPC ..... G11C 29/44; G11C 29/42; G11C 29/4401; G11C 29/52; G06F 12/0246; G06F 12/0253; G06F 2212/1032; G06F 2212/2022; G06F 2212/7204; G06F 2212/7205; G06F 2212/7207

See application file for complete search history.

(56) References Cited

U.S. PATENT DOCUMENTS

| | | | |
|---|---|---|---|
| 9,071,281 B2 | 6/2015 | Casado et al. | |
| 2011/0087950 A1* | 4/2011 | Yu ....................... | G06F 11/1072 714/773 |
| 2011/0239065 A1 | 9/2011 | Byom et al. | |

(Continued)

FOREIGN PATENT DOCUMENTS

| | | |
|---|---|---|
| CN | 101366182 A | 2/2009 |
| TW | 201415468 A | 4/2014 |

(Continued)

*Primary Examiner* — Cynthia Britt
*Assistant Examiner* — Sazzad Hossain
(74) *Attorney, Agent, or Firm* — McClure, Qualey & Rodack, LLP

(57) ABSTRACT

A data storage device with high security is disclosed. A nonvolatile memory provides a storage space divided into a plurality of first-level cells. The first-level cells are grouped into a plurality of second-level cells with each second-level cell containing several first-level cells. Each of the plurality of first-level cells is provided with checking and correcting code by a control unit. When reading a specified first-level cell, the control unit checks data in the specified first-level cell based on the checking and correcting code of the specified first-level cell and thereby performs a self-test on another space of a specified second-level cell. The specified first-level cell is provided in the specified second-level cell.

20 Claims, 6 Drawing Sheets

(56) References Cited

U.S. PATENT DOCUMENTS

| | | | |
|---|---|---|---|
| 2015/0199232 A1 | 7/2015 | Tressler et al. | |
| 2016/0170871 A1* | 6/2016 | Hyun | G06F 3/0679<br>711/103 |
| 2018/0190362 A1* | 7/2018 | Barndt | G11C 16/3431 |

FOREIGN PATENT DOCUMENTS

| | | |
|---|---|---|
| TW | 201419295 A | 5/2014 |
| TW | 201631921 A | 9/2016 |
| TW | 201642275 A | 12/2016 |

\* cited by examiner

| Physical Page | 202 | 204 |
|---|---|---|

FIG. 2

DATA STORAGE DEVICE AND METHOD FOR DATA ERROR MANAGEMENT

CROSS REFERENCE TO RELATED APPLICATIONS

This Application claims priority of China Patent Application No. 201710362875.X, filed on May 22, 2017, the entirety of which is incorporated by reference herein.

BACKGROUND OF THE INVENTION

Field of the Invention

The present invention relates to data storage devices.

Description of the Related Art

There are various forms of nonvolatile memory used in data storage devices for long-term data retention, such as flash memory, magnetoresistive RAM, ferroelectric RAM, resistive RAM, spin transfer torque-RAM (STT-RAM), and so on. How to guarantee the reliability of nonvolatile memory is an important issue in this area of technology.

BRIEF SUMMARY OF THE INVENTION

A data storage device in accordance with an exemplary embodiment of the disclosure includes a nonvolatile memory and a control unit. The nonvolatile memory provides a storage space divided into a plurality of first-level cells. The first-level cells are grouped into a plurality of second-level cells with each second-level cell containing several first-level cells. Each of the plurality of first-level cells is provided with checking and correcting code by the control unit. When reading a specified first-level cell of the plurality of first-level cells, the control unit checks data in the specified first-level cell based on the checking and correcting code of the specified first-level cell to perform a self-test on the nonvolatile memory. The specified first-level cell belongs to a specified second-level cell of the plurality of second-level cells. When more than a first threshold number of errors are detected from the specified first-level cell based on the checking and correcting code of the specified first-level cell, the control unit checks the other N first-level cells, where N is a number. The other N first-level cells also belong to the specified second-level cell. When it is detected that more than M first-level cells between the other N first-level cells are each containing more than a second threshold number of errors, the control unit designates the specified second-level cell as damaged, where M is a number.

In another exemplary embodiment, a method for data error management of a data storage device is disclosed and comprises the following steps: encoding checking- and correcting code for a nonvolatile memory, wherein the nonvolatile memory provides a storage space divided into a plurality of first-level cells, and the first-level cells are grouped into a plurality of second-level cells with each second-level cell containing several first-level cells; providing each of the plurality of first-level cells with checking and correcting code; and when reading a specified first-level cell of the plurality of first-level cells, checking data in the specified first-level cell based on the checking and correcting code of the specified first-level cell to perform a self-test on the nonvolatile memory. The specified first-level cell belongs to a specified second-level cell of the plurality of second-level cells. When more than a first threshold number of errors are detected from the specified first-level cell based on the checking and correcting code of the specified first-level cell, the other N first-level cells are further checked, where N is a number. The other N first-level cells also belong to the specified second-level cell. When it is detected that more than M first-level cells between the other N first-level cells are each containing more than a second threshold number of errors, the specified second-level cell is designated as damaged, where M is a number.

A data storage device in accordance with another exemplary embodiment of the disclosure includes a nonvolatile memory and a control unit. The nonvolatile memory includes a plurality of physical blocks with each physical block including a plurality of pages. The control unit operates according to a read request to get target data from a target page obtained from a plurality of pages of a target block obtained from the plurality of physical blocks. When the number of error bits of the target data exceeds a pre-defined number, the control unit spontaneously reads at least one other page in the target block. When the number of error bits of data spontaneously read from the other page in the target block also exceeds the pre-defined number, the control unit spontaneously copies all valid data of the target block to another physical block.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein:

FIG. 2 illustrates space allocation of a physical page;

DETAILED DESCRIPTION OF THE INVENTION

The following description shows exemplary embodiments of carrying out the invention. This description is made for the purpose of illustrating the general principles of the invention and should not be taken in a limiting sense. The scope of the invention is best determined by reference to the appended claims.

To implement a data storage device, a nonvolatile memory, such as flash memory, a magnetoresistive RAM, a ferroelectric RAM, a resistive RAM, a spin transfer torque-RAM (STT-RAM) and so on, is introduced for long-term data retention. The following discussion uses flash memory in particular as an example, but it is not intended to be limited thereto.

Figure 1:
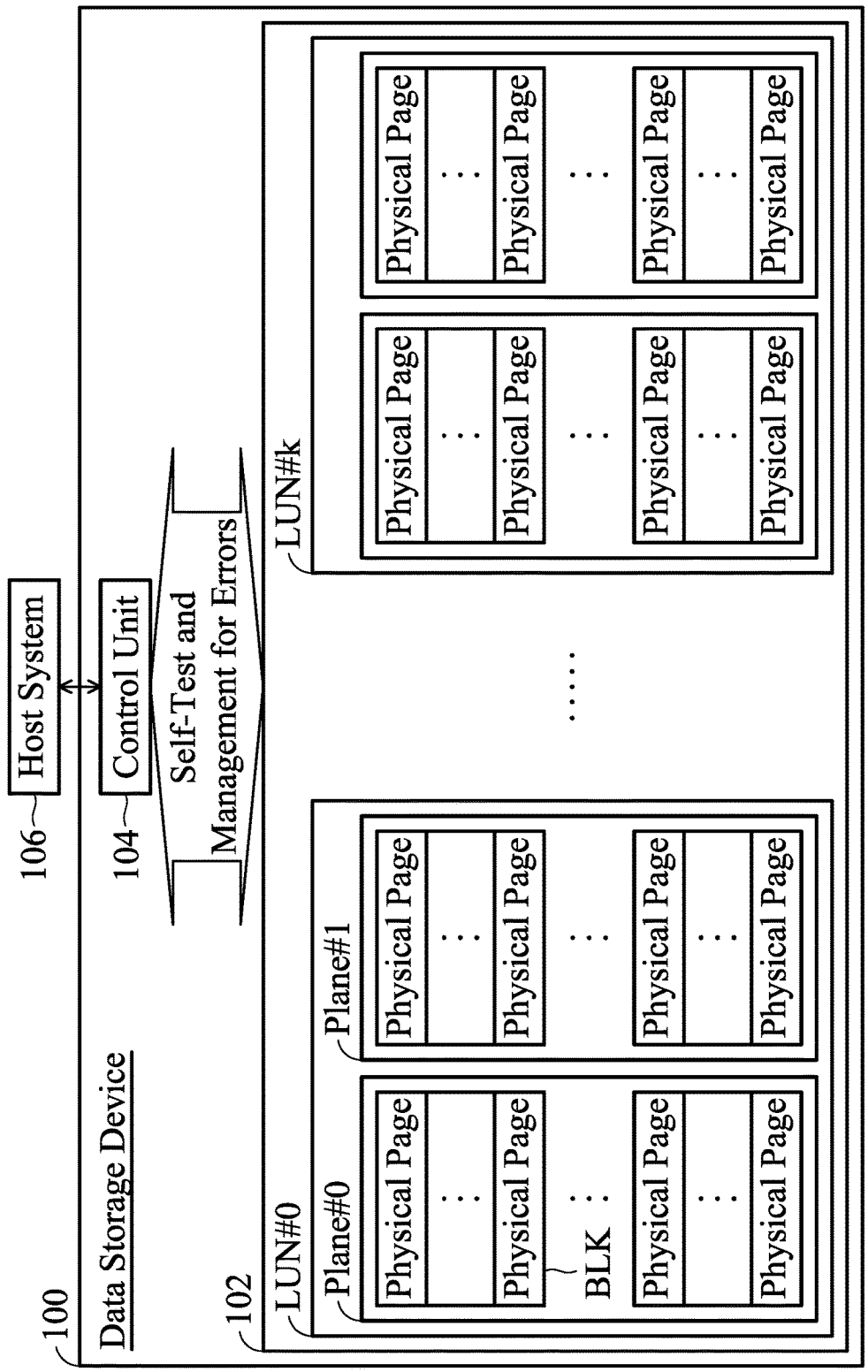
FIG. 1 is a block diagram depicting a data storage device 100 in accordance with an exemplary embodiment of the disclosure.

FIG. 1 is a block diagram depicting a data storage device 100 in accordance with an exemplary embodiment of the disclosure. The data storage device 100 includes a flash memory 102 and a control unit 104. Via the control unit 104, the data storage device 100 is coupled to a host system 106. According to commands issued by the host system 106, the control unit 104 operates the flash memory 102. The control unit 104 may include arithmetic units and a memory space for storing commands or arithmetic data.

FIG. 1 also illustrates the storage space planning of the flash memory 102. The flash memory 102 includes a plurality of dies, and each die corresponds to a logical unit with an LUN number. As shown, the logical units are numbered from LUN#0 to LUN#k. The storage space of a logical unit may be further divided into multiple planes. For example, in the illustration, the space of the logical unit LUN#0 includes planes Plane#0 and Plane#1. Each plane includes a plurality of physical blocks BLK. Each physical block BLK includes a plurality of physical pages, for example, 256 physical pages. The data storage device 100 may be a memory card, a USB flash device, a solid state drive (SSD), or the like. One application is multi-chip packaging, packaging the flash memory 102 with its control unit 104—called an embedded flash memory module (eMMC for example). Portable electronic devices, such as cell phones, tablets, etc., often use flash memory for data storage. The host system 106 in the illustration may be implemented by a microprocessor of a portable electronic device.

When updating data in the flash memory 102, the new data is not overwritten onto the old data at the same storage space. The new data is written to a spare space and the old data is invalidated. Frequent write operations tend to cause the storage space to contain a lot of invalid data, resulting in inefficient utilization of the flash memory 102. For a physical block flooded with invalid physical pages, a garbage collection design is provided for the flash memory 102. The valid data in a source block of garbage collection will be copied to other physical blocks, leaving the source block to contain only invalid data and to be released by an erase operation. However, the erase operation may damage the reliability of the erased physical block, resulting in poor data retention. In addition, the flash memory 102 has read disturbance issues. During a read operation, the peripheral word lines of the target word line must be supplied with high voltages. The high voltage may disturb the data stored in the memory cells controlled by the peripheral word lines. The reliability of the flash memory 102 is also reduced accordingly.

In response to at least the above operational bottlenecks of the flash memory 102, an error checking and correcting mechanism is introduced for the flash memory 102. For example, data may be stored to physical pages with checking and correcting code (such as Error Correcting Code (ECC)). Other preferred embodiments of the checking and correcting code are the Bose Chaudhuri Hocquengham (BCH) Code, the Low Density Parity Check Code (LDPC), and so on. Verification and correction based on ECC, BCH, or LDPC may be done either by hardware or software. In an exemplary embodiment, multiple types of checking and correcting code are used in the data storage device 100, which are selected to be activated, or are activated one by one as needed. In the following, LDPC will be described as an example. Other exemplary embodiments may use other checking and correcting code.

Figure 2:
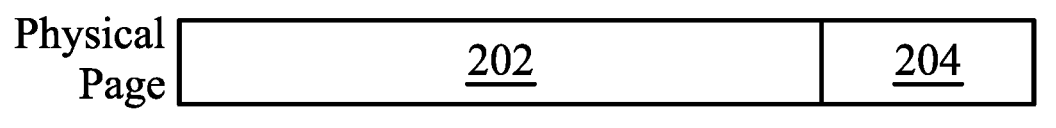

FIG. 2 illustrates a physical page, which provides space 202 storing data received from the host system 106 and space 204 storing metadata (such as checking and correcting code and mapping information). In an exemplary embodiment wherein using the LDPC mechanism, the maximum checking and correcting capability is capable of correcting 76-bit errors per 1 KB data. One physical page may be allocated to correspond to one sector of data or several sectors of data.

Figure 3:
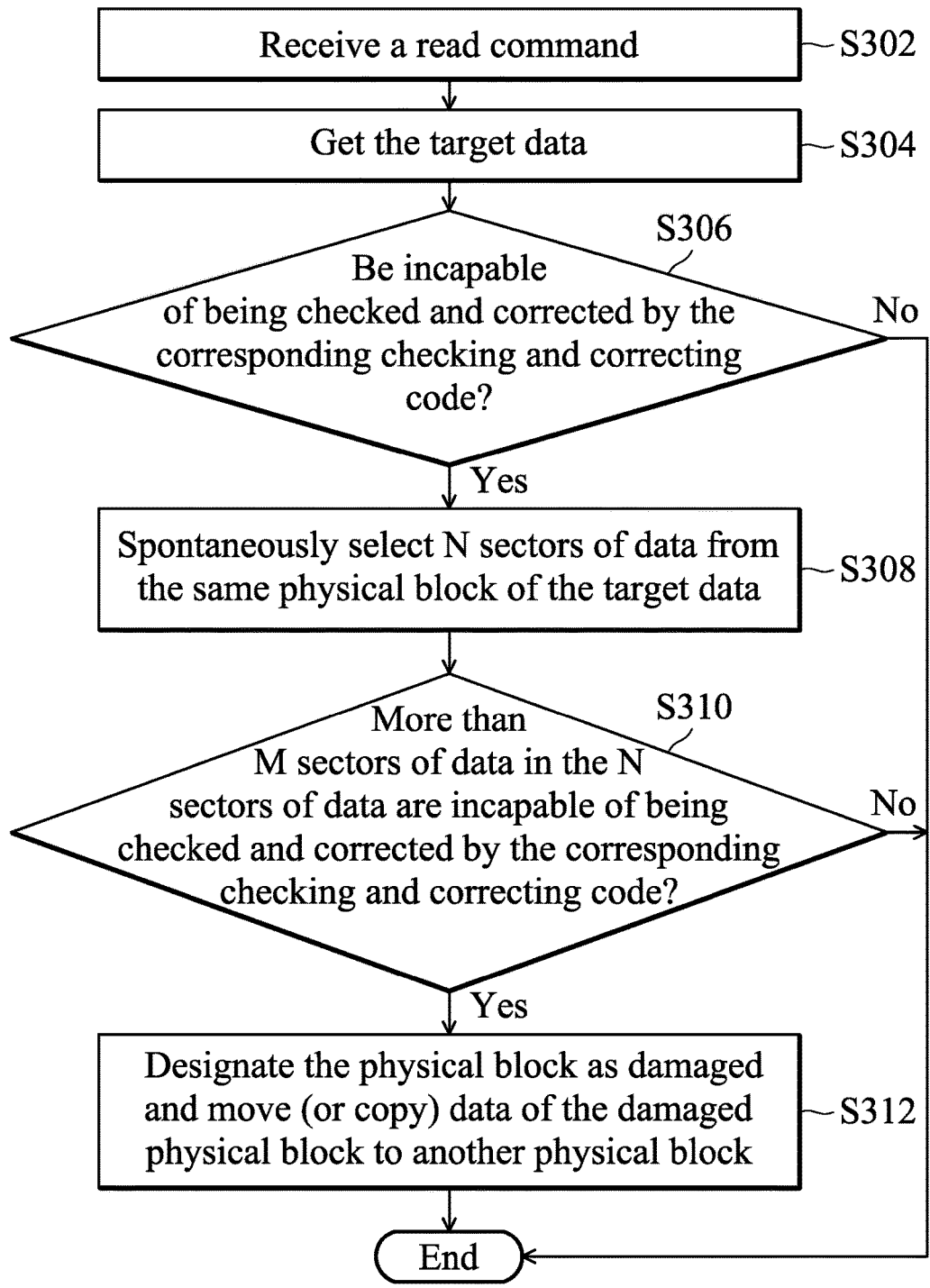
FIG. 3 is a flowchart depicting a data error management procedure for the flash memory 102 in accordance with the first exemplary embodiment of the disclosure.

FIG. 3 is a flowchart depicting a data error management procedure for the flash memory 102 in accordance with the first exemplary embodiment of the disclosure. In step S302, a read command transmitted from the host system 106 is received. A logical address is indicated in the read command. The logical address may be represented by Logical Block Addressing (LBA) or by a number of Global Host Page (GHP). In step S304, the target data is obtained according to a physical address (indicating a target block and a target page in the target block) corresponding to the logical address. The mapping relationship between the logical address and the physical address is recorded in a mapping table H2F (mapping host logical address to physical address). In step S306, it is determined whether the target data is irreparable (e.g. checking whether more than 76-bits of errors are contained in 1 KB data). If the target data is not irreparable, the procedure ends. If yes, the control unit 104 spontaneously selects N sectors of data from the same physical block of the target data (step S308). N is a number. In some exemplary embodiments, the N sectors of data are not accessed from a space in a particular offset from the space of the target data. The physical address storing the N sectors of data differs from the physical address storing the target data. In step S310, it is determined that whether more than M sectors of data in the N sectors of data are irreparable. If not irreparable, the procedure ends. If yes, step S312 is performed. In step S312, the control unit 104 designates the physical block as damaged and moves (or copies) data (all, or only valid data) of the damaged physical block to another physical block to maintain data correctness.

Figure 4:
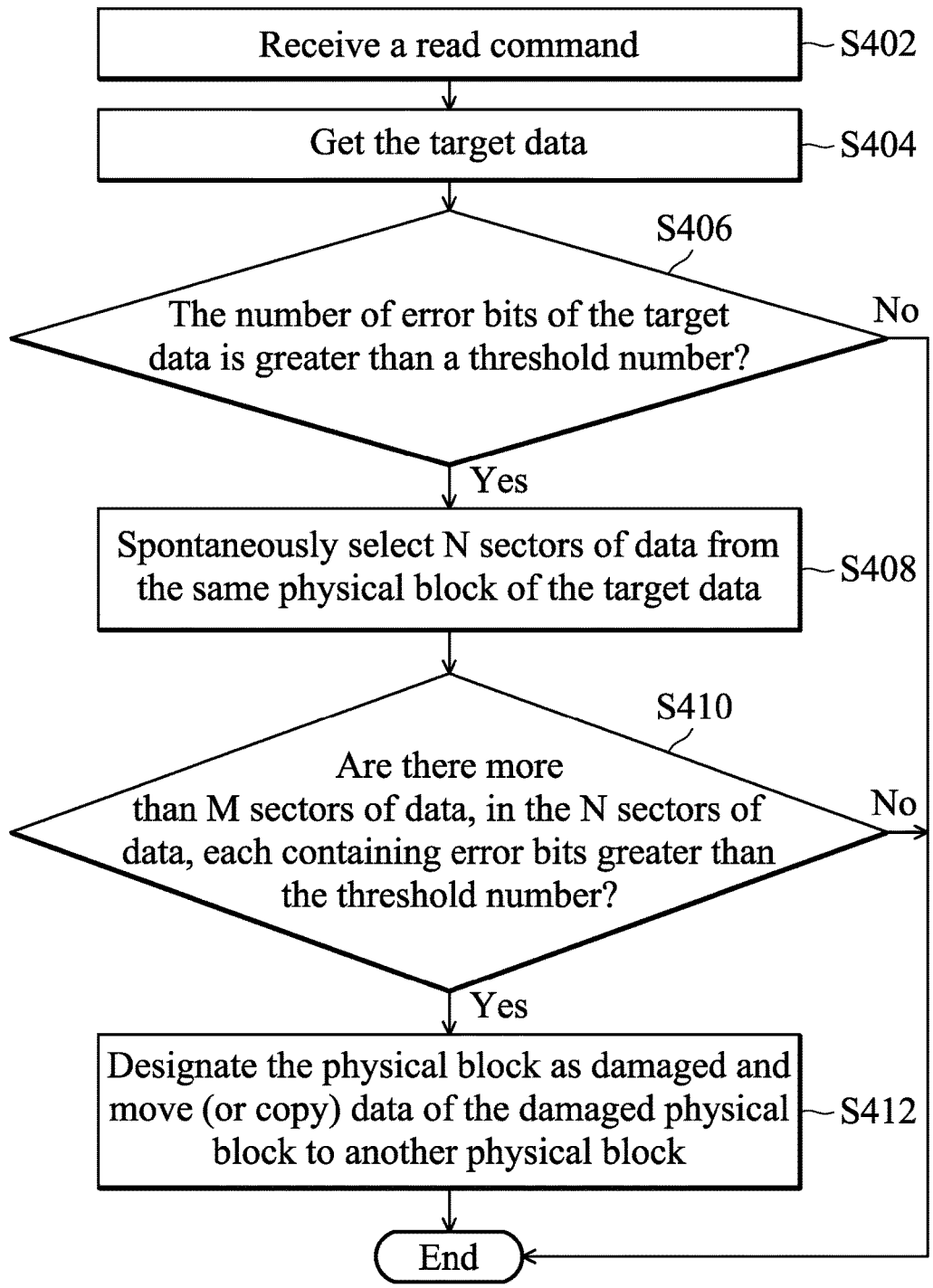
FIG. 4 is a flowchart illustrating a data error management procedure for the flash memory 102 in accordance with the second exemplary embodiment of the disclosure.

FIG. 4 is a flowchart illustrating a data error management procedure for the flash memory 102 in accordance with the second exemplary embodiment of the disclosure. In step S402, a read command transmitted from the host system 106 is received. In step S404, the target data is obtained according to a physical address corresponding to the logical address indicated by the read command. In step S406, the number of error bits of the target data is evaluated and it is determined whether the number of error bits is greater than a threshold number (e.g. more than 70 bits of errors are obtained from 1 KB data). If no, the procedure ends. If yes, the control unit 104 spontaneously selects N sectors of data from the same physical block of the target data (step S408). N is a number. In step S410, it is determined that in the N sectors of data whether more than M sectors of data each containing more error bits than the threshold number. If no, the procedure ends. If yes, step S412 is performed. In step S412, the control unit 104 designates the physical block as damaged and moves (or copies) data (all, or only valid data) of the damaged physical block to another physical block to maintain data correctness.

The main differences between FIG. 3 and FIG. 4 are the judgments performed by steps S306 and S310 and the judgments performed by steps S406 and S410. When a sector of data is determined irreparable in step S306 or S310, the number of error bits in the sector of data is too high and exceeds the checking and correcting capability of LDPC (i.e. more than 76 bits of errors in 1 KB data). When a sector of data is determined in step S406 or S410 that contains error bits exceeding the threshold number (e.g. the number of error bits in 1 KB just exceeding 70), the number of error bits in the sector of data is still within the checking and correcting capability of LDPC. The threshold number used in the second exemplary embodiment protects data in the flash memory from being completely damaged and irreparable. The dangerous data (almost damaged but still repairable) are discovered in a timely manner. The data of the dangerous physical block is swiftly moved (or copied) to another physical block for data correctness by checking the other data within the physical block that contains the dangerous data.

Figure 5:
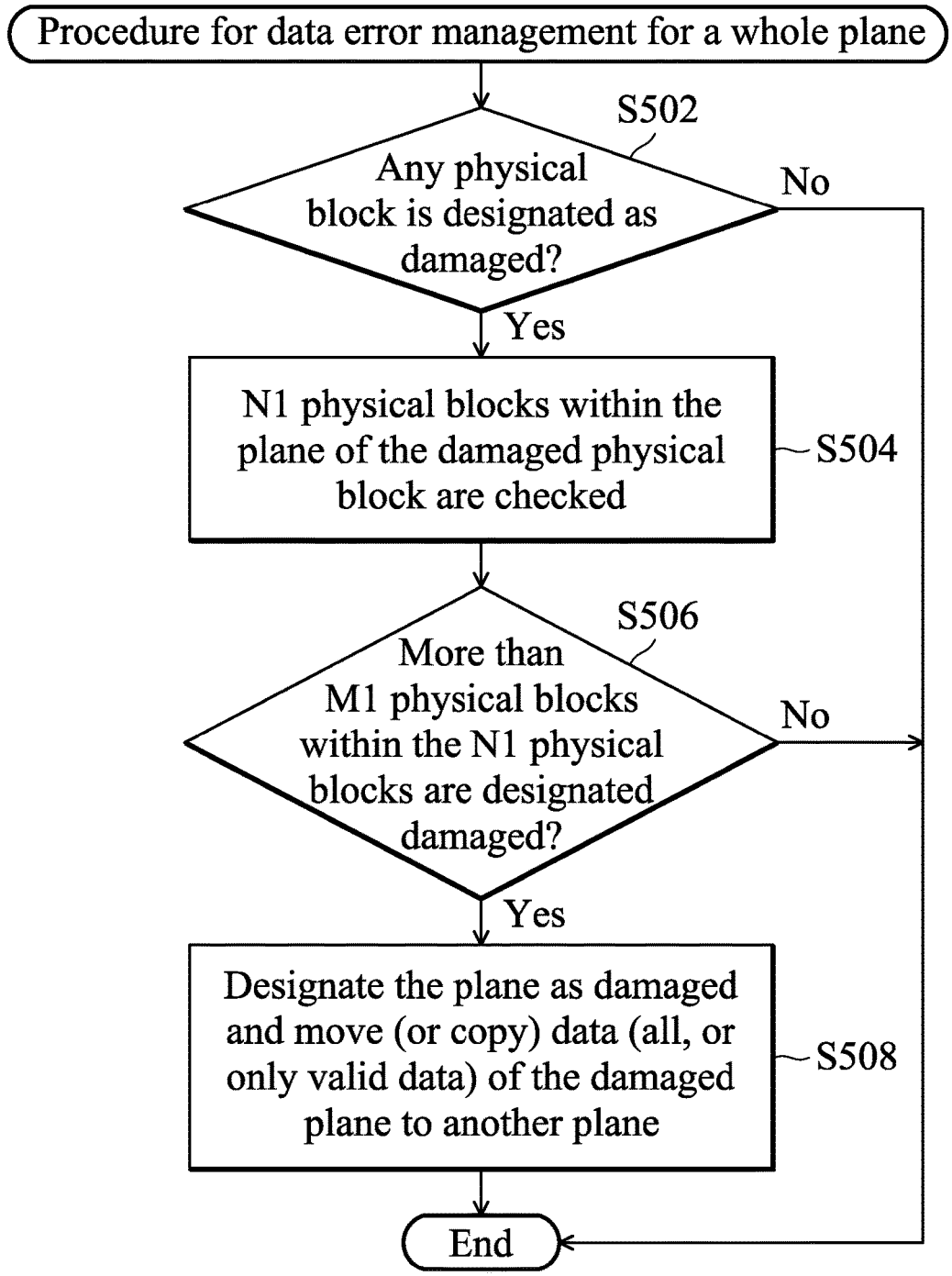
FIG. 5 is a flowchart by which data error management is applied to guarantee the data correctness of a whole plane of the flash memory 102.

In some exemplary embodiments, the aforementioned procedure for data error management is further applied to confirm the reliability of a whole plane of the flash memory 102 and FIG. 5 is a flowchart. In step S502, it is determined whether any physical block is designated as damaged (e.g. designated as damaged by step S312 or step S412). In step S504, N1 physical blocks within the plane of the damaged physical block are checked, where N1 is a number. The N1 physical blocks may be checked by the same concept used in the judgments made in steps S308 to S312, or be checked by the same concept used in the judgments made in steps S408 to S412. Accordingly, the number of damaged physical blocks within the N1 physical blocks is obtained. It is determined in step S506 whether more than M1 physical blocks within the N1 physical blocks are designated as damaged. If no, the procedure ends. If yes, step S508 is performed. In step S508, the control unit 104 designates the plane as damaged and moves (or copies) data (all, or only valid data) of the damaged plane to another plane to maintain data correctness.

Figure 6:
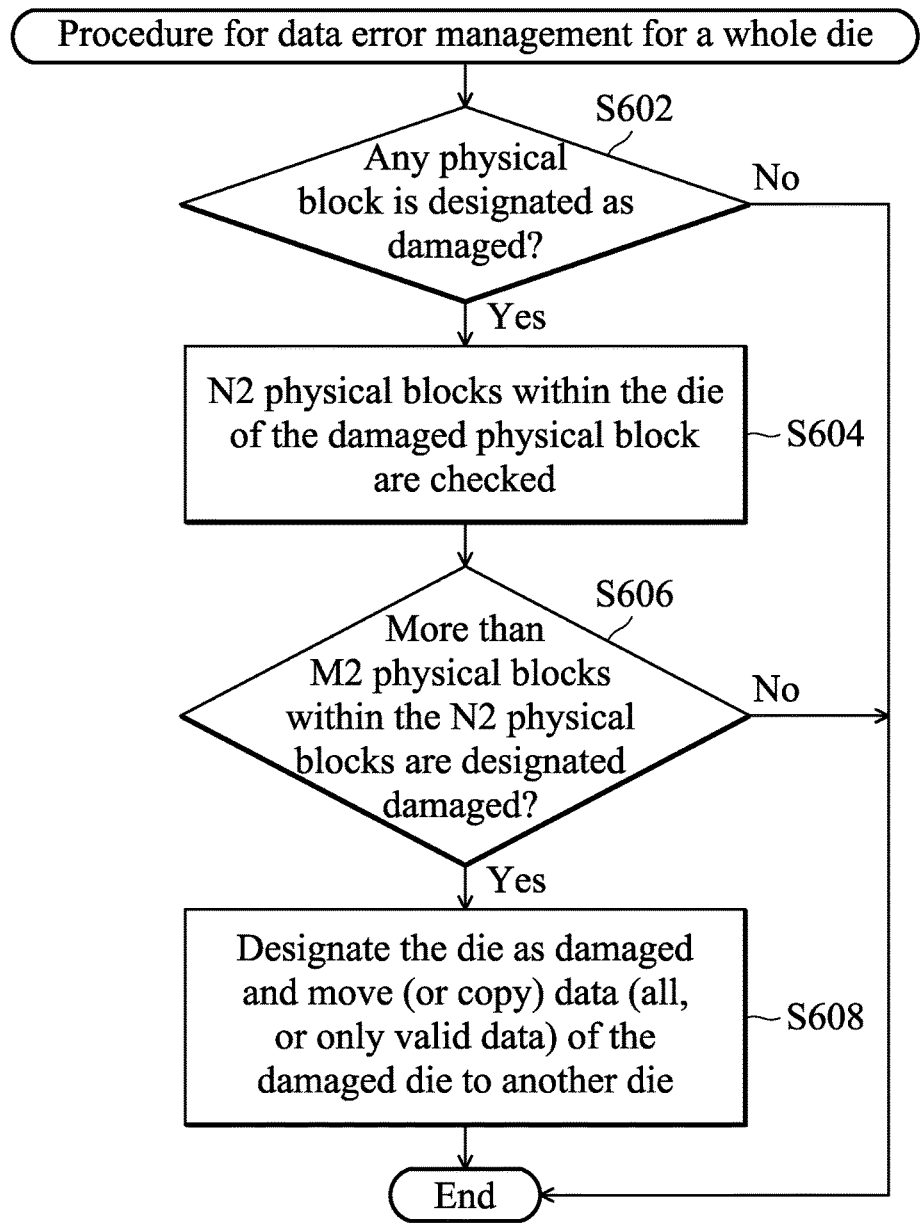
FIG. 6 is a flowchart by which data error management is applied to guarantee the data correctness of a whole die of the flash memory 102.

In some exemplary embodiments, the aforementioned procedure for data error management is further applied to confirm the reliability of a whole die of the flash memory 102 and FIG. 6 is a flowchart. In step S602, it is determined whether any physical block is designated as damaged (e.g. designated as damaged by step S312 or step S412). In step S604, N2 physical blocks within the logical unit of the damaged physical block are checked, where N2 is a number. The N2 physical blocks may be checked by the same concept used in the judgments made in steps S308 to S312, or be checked by the same concept used in the judgments made in steps S408 to S412. Accordingly, the number of damaged physical blocks within the N2 physical blocks is obtained. It is determined in step S606 whether more than M2 physical blocks within the N2 physical blocks are designated as damaged. If no, the procedure ends. If yes, step S608 is performed. In step S608, the control unit 104 designates the die as damaged and moves (or copies) data (all, or only valid data) of the damaged die to another die to maintain data correctness.

The aforementioned hierarchical self-testing and data maintenance concepts used in the aforementioned exemplary embodiments may be applied to any level of the hierarchical storage space provided by the flash memory 102. In an exemplary embodiment, data is written to the flash memory 102 in super pages. For one super page, the storage space includes several physical pages provided by several planes (or several dies). The targets to be checked are selected by super pages. The hierarchical self-testing and data maintenance concepts can be applied to numerous hierarchical structures and are not repeated here.

In the disclosure, the flash memory 102 is not only checked and corrected in response to read commands from the host system 106. The control unit 104 controls the error detection and data maintenance of the flash memory 102. The N physical pages detected by step S308/S408, the N1 physical blocks detected by step S504, and the N2 physical blocks detected by step S604 all are not at the physical addresses corresponding to the logical addresses indicated by the received read commands (e.g. the read commands received by step S302 or S402). The dangerous data is swiftly moved (copied) to another space by the spontaneous self-testing and data maintenance mechanism before being completely damaged and becoming irreparable. In this manner, the reliability of the flash memory 102 is greatly improved. When the threshold number used to trigger the self-testing is properly designed, it is less likely to have data that is too damaged to be repaired.

In an exemplary embodiment, the self-testing and data maintenance procedure is triggered by read commands sent from the host system 106, such as the read commands received by steps S302 and S402.

In an exemplary embodiment, the self-testing and data maintenance procedure is triggered by write commands sent from the host system 106. When operating the flash memory 102 to execute the write commands issued by the host system 106, the control unit 104 further reads back the write data to check whether the data is correctly written to the flash memory 102. The flowchart of FIG. 3 or FIG. 4 may be applied to the reading back step of the write data.

In an exemplary embodiment, the self-testing and data maintenance procedure is triggered by garbage collection of the flash memory 102. When performing garbage collection on the flash memory 102, the control unit 104 further involves several read operations. The flowchart of FIG. 3 or FIG. 4 may be applied to the read operations of garbage collection.

In an exemplary embodiment, the self-testing and data maintenance procedure is performed in the way of foreground or background operations of the flash memory 102. The self-testing and data maintenance procedure performed in the way of background operations of the flash memory 102 is not requested by commands issued by the host system 106 and received by the control unit 104.

In the disclosure, it is determined whether a physical block is dangerous or not based on several sectors of data read from several physical pages of the same physical block. The disclosure is more reliable in comparison with conventional techniques which determine a damaged physical block based on only the data stored in the detected physical page.

In an embodiment, when a correction based LDPC fails, the data storage device 100 can still use a redundant array of independent disks (RAID) for data recovery.

Other techniques that use the aforementioned concepts to achieve self-testing and data maintenance of nonvolatile memory are within the scope of the disclosure. Based on the above contents, the present invention further relates to methods for operating a data storage device.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A data storage device, comprising:
  a nonvolatile memory, providing a storage space divided into a plurality of first-level cells, wherein the first-level cells are grouped into a plurality of second-level cells with each second-level cell containing several first-level cells; and a control unit, by which each of the plurality of first-level cells is provided with checking and correcting code, wherein:

when reading a specified first-level cell of the plurality of first-level cells, the control unit checks data in the specified first-level cell based on the checking and correcting code of the specified first-level cell to thereby perform a self-test on the nonvolatile memory;

the specified first-level cell belongs to a specified second-level cell of the plurality of second-level cells;

when more than a first threshold number of errors are detected from the specified first-level cell based on the checking and correcting code of the specified first-level cell, the control unit checks the other N first-level cells, where N is a number;

the other N first-level cells also belong to the specified second-level cell; and when it is detected that more than M first-level cells between the other N first-level cells are each containing more than a second threshold number of errors, the control unit designates the specified second-level cell as damaged, where M is a number.

2. The data storage device as claimed in claim 1, wherein:

when designating the specified second-level cell as damaged, the control unit moves data in the specified second-level cell to another second-level cell of the plurality of second-level cells.

3. The data storage device as claimed in claim 1, wherein:

the second-level cells are further grouped into a plurality of third-level cells with each third-level cell containing several second-level cells;

when designating the specified second-level cell as damaged, the control unit checks the other N2 first-level cells obtained from the other N1 second-level cells, where N1 and N2 are numbers; and the specified second-level cell belongs to a specified third-level cell of the plurality of third-level cells, and the other N1 second-level cells also belong to the specified third-level cell.

4. The data storage device as claimed in claim 3, wherein:

when it is detected that more than M2 first-level cells between the other N2 first-level cells are each containing more than a third threshold number of errors, the control unit designates the specified third-level cell as damaged, where M2 is a number.

5. The data storage device as claimed in claim 4, wherein:

when designating the specified third-level cell as damaged, the control unit moves data in the specified third-level cell to another third-level cell of the plurality of third-level cells.

6. The data storage device as claimed in claim 1, wherein:

the control unit reads the specified first-level cell based on a read command issued by a host system, or based on a read-back operation of a write command issued by the host system.

7. The data storage device as claimed in claim 1, wherein:

the control unit reads the specified first-level cell for garbage collection.

8. A method for data error management of a data storage device, comprising:

encoding checking and correcting code for a nonvolatile memory, wherein the nonvolatile memory provides a storage space divided into a plurality of first-level cells, and the first-level cells are grouped into a plurality of second-level cells with each second-level cell containing several first-level cells;

providing each of the plurality of first-level cells with checking and correcting code; and when reading a specified first-level cell of the plurality of first-level cells, checking data in the specified first-level cell based on the checking and correcting code of the specified first-level cell to thereby perform a self-test on the nonvolatile memory, wherein:

the specified first-level cell belongs to a specified second-level cell of the plurality of second-level cells;

when more than a first threshold number of errors are detected from the specified first-level cell based on the checking and correcting code of the specified first-level cell, the other N first-level cells are further checked, where N is a number;

the other N first-level cells also belong to the specified second-level cell; and when it is detected that more than M first-level cells between the other N first-level cells are each containing more than a second threshold number of errors, the specified second-level cell is designated as damaged, where M is a number.

9. The method as claimed in claim 8, wherein:

when designating the specified second-level cell as damaged, data in the specified second-level cell is moved to another second-level cell of the plurality of second-level cells.

10. The method as claimed in claim 8, further comprising:

when designating the specified second-level cell as damaged, checking the other N2 first-level cells obtained from the other N1 second-level cells, where N1 and N2 are numbers, wherein:

the second-level cells are further grouped into a plurality of third-level cells with each third-level cell containing several second-level cells;

the specified second-level cell belongs to a specified third-level cell of the plurality of third-level cells, and the other N1 second-level cells also belong to the specified third-level cell.

11. The method as claimed in claim 10, further comprising:

when it is detected that more than M2 first-level cells between the other N2 first-level cells are each containing more than a third threshold number of errors, designating the specified third-level cell as damaged, where M2 is a number.

12. The method as claimed in claim 11, further comprising:

when designating the specified third-level cell as damaged, moving data in the specified third-level cell to another third-level cell of the plurality of third-level cells.

13. The method as claimed in claim 8, further comprising:

reading the specified first-level cell based on a read command issued by a host system, or based on a read-back operation of a write command issued by the host system.

14. The method as claimed in claim 8, further comprising:

reading the specified first-level cell for garbage collection.

15. A data storage device, comprising:

a nonvolatile memory, including a plurality of physical blocks with each physical block including a plurality of pages;

a control unit, operating according to a read request to get target data from a target page obtained from a plurality of pages of a target block obtained from the plurality of physical blocks, wherein:

when the number of error bits of the target data exceeds a pre-defined number, the control unit spontaneously reads at least one other page in the target block;

when the number of error bits of data spontaneously read from the at least one other page in the target block also exceeds the pre-defined number, the control unit spontaneously copies all valid data of the target block to another physical block.

16. The data storage device as claimed in claim 15, wherein:

the pre-defined number defines the maximum checking and correcting capability of the checking and correcting code used in the nonvolatile memory.

17. The data storage device as claimed in claim 15, wherein:

the pre-defined number is less than the maximum checking and correcting capability of the checking and correcting code used in the nonvolatile memory.

18. The data storage device as claimed in claim 15, wherein:

the read request is issued by a host system.

19. The data storage device as claimed in claim 15, wherein:

the read request occurs due to a read-back operation of a write request issued by a host system.

20. The data storage device as claimed in claim 15, wherein:

the read request occurs due to garbage collection.

* * * * *